United States Patent [19]
Kim et al.

[11] Patent Number: 5,487,050
[45] Date of Patent: Jan. 23, 1996

[54] DECODING CIRCUIT AND METHOD FOR A SEMICONDUCTOR MEMORY DEVICE

[75] Inventors: Kyeong-Rae Kim, Suwon; Seung-Kweon Yang, Seoul; Hee-Choul Park, Suwon; Du-Eung Kim, Yongin, all of Rep. of Korea

[73] Assignee: Samsung Electronics Co., Ltd., Suwon, Rep. of Korea

[21] Appl. No.: 229,082

[22] Filed: Apr. 18, 1994

[30]     Foreign Application Priority Data

Apr. 16, 1993 [KR]    Rep. of Korea ................... 6413/1993

[51] Int. Cl.⁶ ................................................. G11C 8/00
[52] U.S. Cl. ................... 365/230.06; 365/230.03
[58] Field of Search ................... 365/230.06, 230.03, 365/230.01, 189.01

[56]             References Cited

U.S. PATENT DOCUMENTS 4,984,212   1/1991   Fukuda ................... 365/230.03

Primary Examiner—A. Zarabian
Attorney, Agent, or Firm—Charles R. Donohoe; Stephen R. Whitt

[57]             ABSTRACT

A decoding circuit and method for a semiconductor memory device simplifies a decoding process by individually performing a large block decoding and small block decoding operations, and thereby reduces the total time delay taken in an address decoding process and layout area occupied by decoding circuits. The decoding circuit for a semiconductor memory device having a memory cell array including a plurality of large blocks, each large block including m small blocks (wherein m= 2,3, . . . ) and having a plurality of memory cells being arranged in a matrix form, and a plurality of reading/writing circuits each corresponding to said large blocks, includes a first decoding circuit for receiving a first address to simultaneously select respective specific small block in each of the large blocks, corresponding to the first address, and a second decoding circuit for receiving a second address to enable a selected one of the reading/writing circuits corresponding to said second address.

10 Claims, 5 Drawing Sheets

DECODING CIRCUIT AND METHOD FOR A SEMICONDUCTOR MEMORY DEVICE

FIELD OF THE INVENTION

The present invention relates to semiconductor memory devices and more particularly to a decoding circuit and a method for conducting data reading/writing operations.

BACKGROUND OF THE INVENTION

In general, the higher density a semiconductor memory device has, the lower power consumption the semiconductor memory device requires. To satisfy this requirement, a memory cell array composed of a plurality of memory cells is divided into a plurality of sub-array blocks. Thus, when a predetermined memory cell is selected, the semiconductor memory device may suppress power consumption by enabling the memory cell array by the sub-array block unit. The pursuit for the sub-array block will be considered more and more, as the density of the semiconductor memory device increases. On the other hand, when data is read out or written into the semiconductor memory device, all bits of an address are to be decoded so as to select a given memory cell. However, the time delay of the address decoding operation causes operation speed of the semiconductor memory device to be reduced. Therefore, it is desirable that the semiconductor memory device have an address decoding circuit which does not reduce operation speed of the semiconductor memory device.

FIG. 1 is a schematic block diagram showing a conventional decoding device for a semiconductor memory. A memory cell array 10 is composed of n large blocks LB1–LBn, each of the large blocks having m small blocks SB11–SBnm in which memory cells are arranged in matrix form. In the drawing, reference numeral 20 represents a row address buffer, reference numeral 30 a row predecoder, reference numeral 40 a row decoder, reference numeral 50 a column address buffer, reference numeral 60 a column predecoder, reference numeral 70 a small block predecoder, reference numeral 80 a large block predecoder, reference numeral 90 a column decoder, and reference numeral 100 n reading/writing circuits R/W1–R/Wn each corresponding to n large blocks LB1–LBn.

FIG. 2 shows the operational timing diagram for a decoding operation conducted by the device of FIG. 1. Row predecoder 30 decodes i address signals Ax1–Axi inputted from row address buffer 20 and outputs h address signals to row decoder 40. Thereafter, row decoder 40 outputs one of k row address signals to memory cell array 10. Column address buffer 50 buffers j address signals Ay1–Ayj and outputs p address signals to column predecoder 60, q address signals to small block predecoder 70, and r address signals to large block predecoder 80. Column predecoder 60, small block predecoder 70, and large block predecoder 80, respectively, decode p, q, and r address signals and respectively output l, m, and n address signals to column decoder 90. Column decoder 90 outputs one of b address signals to memory cell array 10. The memory cells connected to a given word line are selected by row decoder 40, and a specific large block is selected by the upper bits of the address signal outputted from column decoder 90. Subsequently, the small blocks in the selected large block are selected by the next upper bits of the address signal, and columns in the selected small blocks are ultimately selected by the lower bits of the address signal. Typically, reading/writing circuits R/W1–R/Wn are divided so as to have the same number as that of large blocks LB1–LBn. That is, each of large blocks LB1–LBn serves as a unit of dividing reading/writing circuits R/W1–R/Wn. D-bit data is inter-transferred between large blocks LB1–LBn and reading/writing circuits R/W1–R/Wn. Therefore, upon the data reading operation, if a given memory cell is selected in the same manner as previously stated, a selected one of reading/writing circuits R/W1–R/Wn selected by the address signal outputted from large block predecoder 80, corresponding to large blocks LB1–LBn is selected and thereafter, data of the selected memory cell is read out to transfer through a data input/output line I/O. On the contrary, in the case of performing a data writing operation into a predetermined memory cell, the memory cell in which data is to be written is selected in the same manner as discussed above. As shown in FIG. 2, reading/writing circuit selection signal 311 and large block selection signal 312 are enabled by large block selection address signal 301, thereby causing a predetermined reading/writing circuit and large block to be selected, respectively. Then, small block selection signal 313 is enabled by large block selection signal 312 and small block selection address signal 302, thereby causing the small block in the selected large block to be selected. Thereafter, column selection signal 314 is enabled by small block selection signal 313 and column selection address signal 303, thereby causing a desired column to be ultimately selected.

If in a conventional decoding apparatus and method a column is to finally be selected, firstly a large block is selected by the upper bits of an address signal. Secondly, the small blocks in the selected large block must be selected. Lastly, a predetermined column is selected. In this case, address signals for selecting reading/writing circuits must be decoded in the same manner as the large blocks discussed above. The same address bits for decoding large blocks, as shown in FIG. 1, should also be used in the reading/writing circuits. Accordingly, it is required that a decoding path for receiving a corresponding address should be constructed. Such a requirement, however, produces a problem in that the time delay increases due to the signal passing through many logic gates and additionally, this solution increases the non-effective layout area.

SUMMARY OF THE INVENTION

It is therefore an object of the present invention to provide a decoding circuit for a semiconductor memory device due to which the time delay in gate stages and layout area occupied thereby can be reduced.

It is another object of the present invention to provide a decoding circuit for a semiconductor memory device in which the circuit construction for performing a column selection operation can be simplified.

It is still another object of the present invention to provide a decoding circuit for a semiconductor memory device capable of achieving a minimized decoding process by supplying a column decoder which selects only a specific small block of a plurality of small blocks by using the input of a column address. To facilitate this process, the semiconductor memory device has a memory cell array including a plurality of large blocks with each large block being comprised of a plurality of small blocks.

It is still a further object of the present invention to provide a decoding method capable of executing a column selection operation through a minimized decoding process.

To achieve these objects, the present invention is directed to a semiconductor memory device which has a memory cell array comprising a plurality of large blocks, each large block being comprised of a plurality of small blocks, a column decoder for simultaneously selecting respective specific small blocks in each of the large blocks of the memory cell array, and a reading/writing circuit for selecting only a specific large block of the large blocks.

According to an aspect of the present invention, a decoding circuit for a semiconductor memory device includes a column address buffer for buffering a column address supplied from a system to convert the column address into an internal signal level, a small block predecoder for receiving a column address associated with the selection of the small block of the output signals of the column address buffer, a column decoder for receiving the output signal of the small block predecoder to select a specific small block, a large block predecoder for receiving a column address associated with the selection of the large block of the output signals of the column address buffer, a reading/writing circuit for receiving the output signal of the large block predecoder to select a specific large block.

According to another aspect of the present invention, a decoding method for a semiconductor memory device having a memory cell array with a plurality of large blocks, each large block being comprised of m small blocks (wherein m=2,3, ... ), and a plurality of memory cells being arranged in matrix form, includes a first decoding step for simultaneously selecting a respective specific small block Y in each of the large blocks through a first decoding circuit when the first address associated with selection of the small block is inputted; a second decoding step for selecting a column in the selected small block through the first decoding circuit; and a third decoding step for selecting a large block corresponding to the second address associated with of the large blocks, when a second address associated with selection of the large block is inputted, thereby executing an operation for selecting a memory cell.

BRIEF DESCRIPTION OF DRAWING

These and other objects, features, and advantages of the present invention are better understood by reading the following detailed description of the invention, taken in conjunction with the accompanying drawings. In the drawings, it should be noted that like elements represent like symbols or reference numerals, wherein.

DETAILED DESCRIPTION OF THE PREFERRED EMBODIMENTS

In the following description, numerous specific details, such as a column address, a small block predecoder, a large block predecoder and so on, are set forth in order to provide a thorough understanding of the present invention. It will, however, be obvious to one skilled in the art that the present invention may be practiced without these specific details, or with alternative specific details.

The term "large block" as used herein refers to a cell array construction in which a plurality of blocks are divisibly arranged in row and column directions so as to be selected by a combination of upper bits of an address. The term "small block" used herein refers to a plurality of blocks being divisibly arranged in each of the large blocks so as to be selected by the combination of all address bits except for the upper bits of address used for selecting the large blocks.

Figure 1:
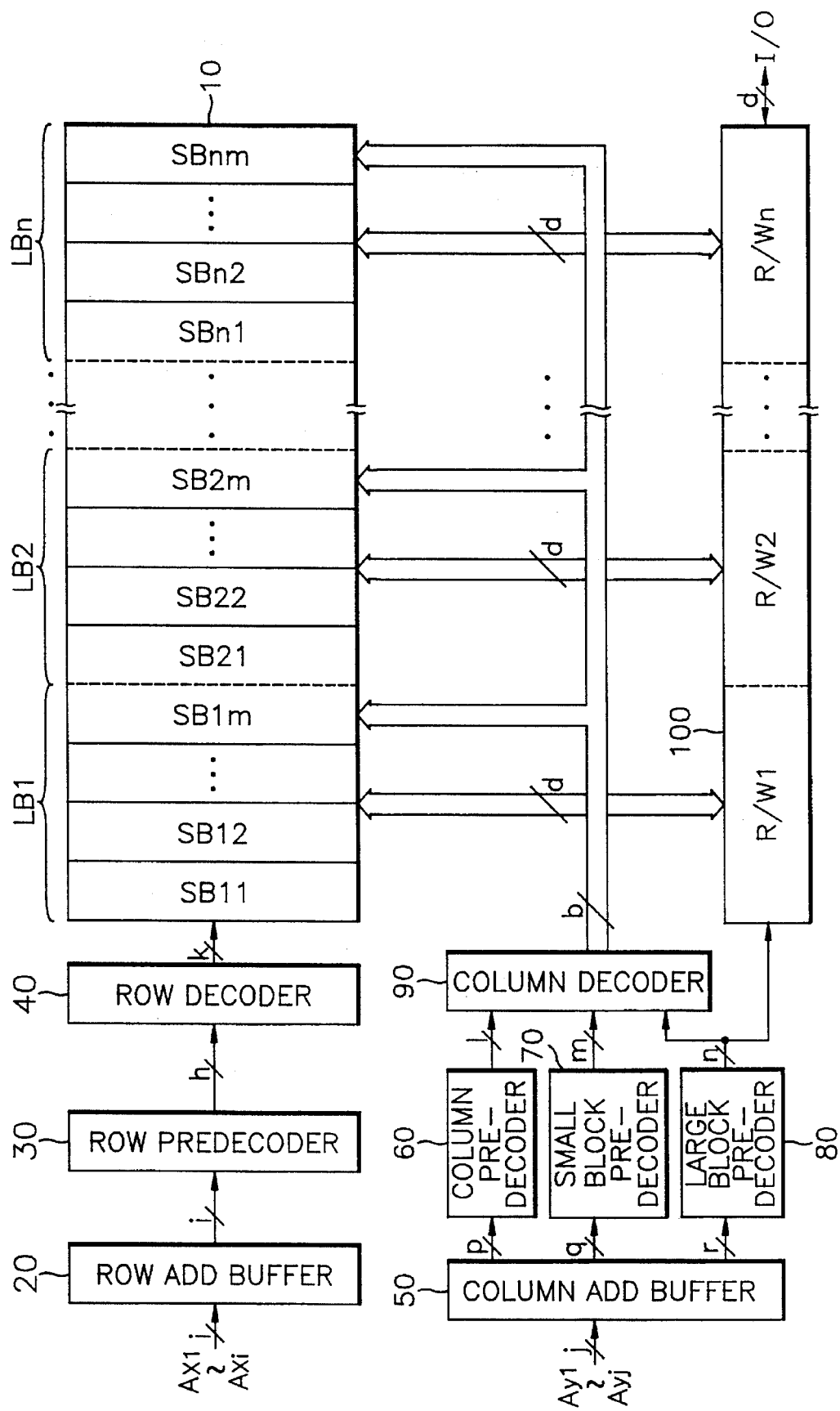
FIG. 1 is a schematic block diagram showing a conventional decoding method for a semiconductor memory device.
Figure 2:
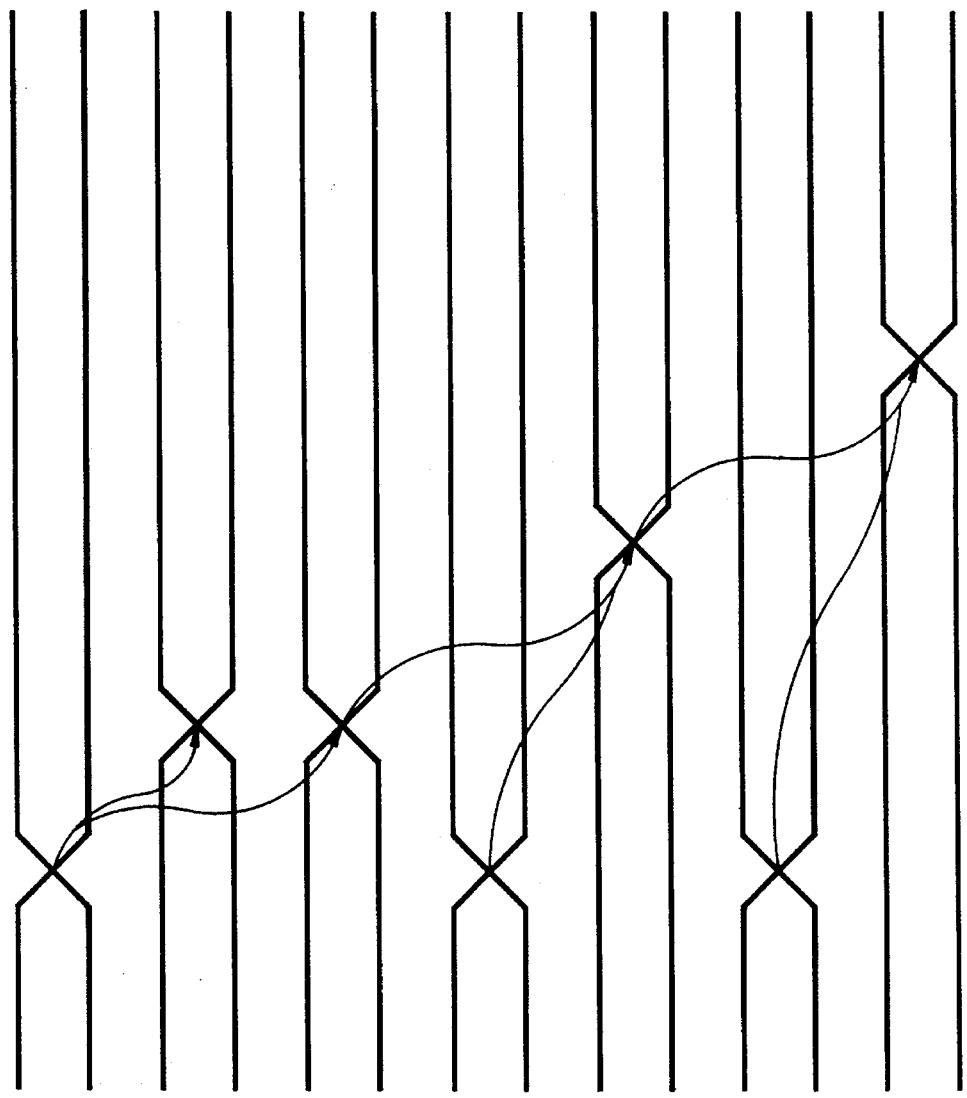
FIG. 2 is an operational timing diagram of FIG. 1.
Figure 3:
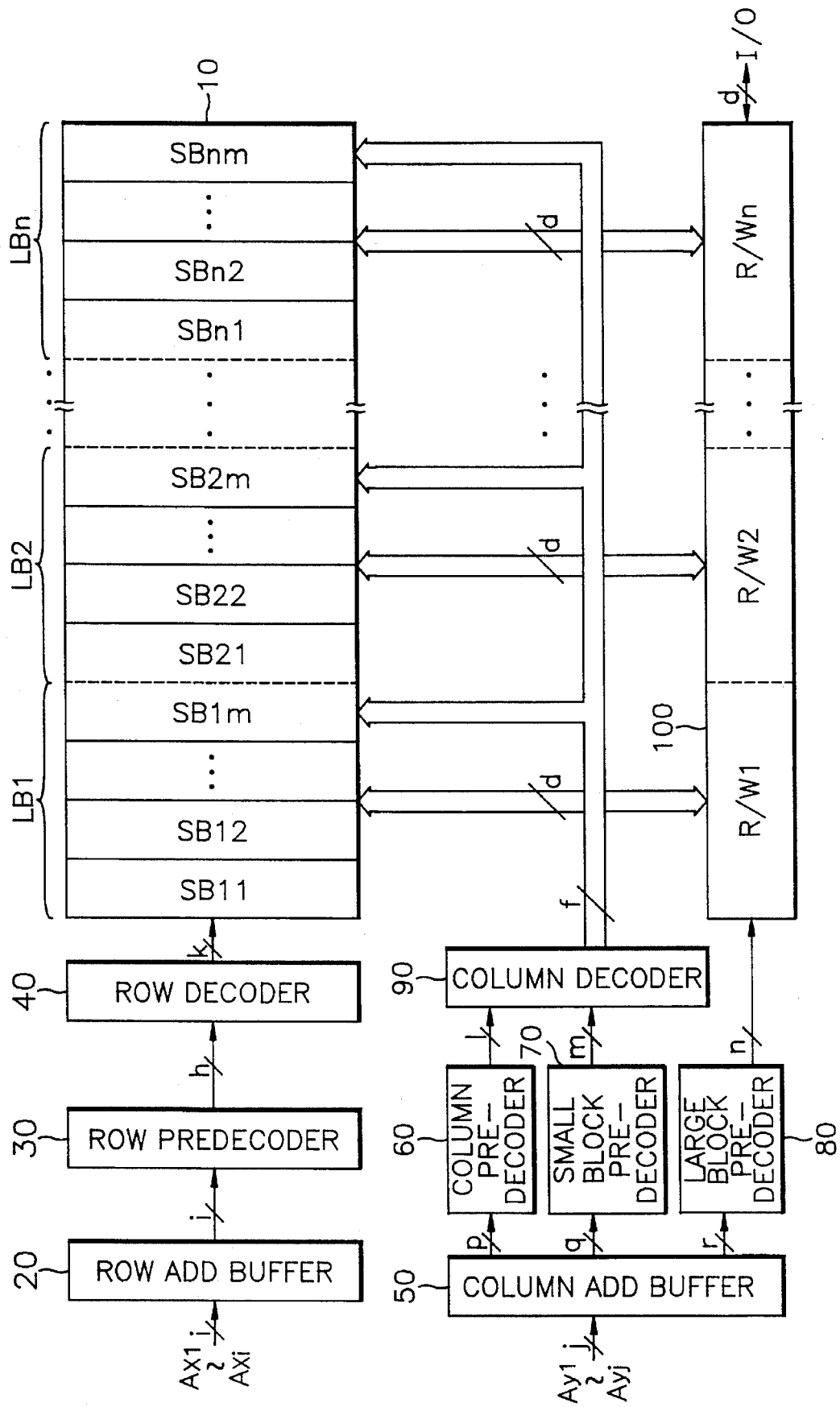
FIG. 3 is a schematic block diagram showing a decoding method for a semiconductor memory device according to the present invention.

FIG. 3 is a schematic block diagram showing a decoding method for a semiconductor memory device according to the present invention. The construction of FIG. 3 although similar to that of FIG. 1, differs in that the output signal of large block predecoder 80 inputs only to reading/writing circuit 100 composed of reading/writing circuits R/W1–R/Wn, and column decoder 90 outputs f address signals to each of large blocks LB1–LBn. The characteristic of such a construction is that column decoder 90 serves to select small blocks constituting large blocks of memory cell array 10 by receiving only the address associated with the selection of small blocks, which suggests that the selection of large blocks is not made by column decoder 90. Further, large block predecoder 80 receives only an address associated with the selection of large blocks and supplies the output signal only to reading/writing circuit 100, thereby rendering the selection of the large blocks of memory cell array 10 to be executed by reading/writing circuit 100. Consequently, the differentiating characteristic of the construction of FIG. 3 is that column decoder 90 selects a specific small block from each of the large blocks and reading/writing circuit 100 then selects the large block constituting the desired small block from among the plurality of small blocks. In this case, since data to be outputted or inputted from a plurality of the small blocks at the same time enabled by the column decoder is transmitted to data lines connected to respective components, it may be commonly expected that a collision of data occurs. However, it is well understood from the following description that this does not occur.

Figure 4:
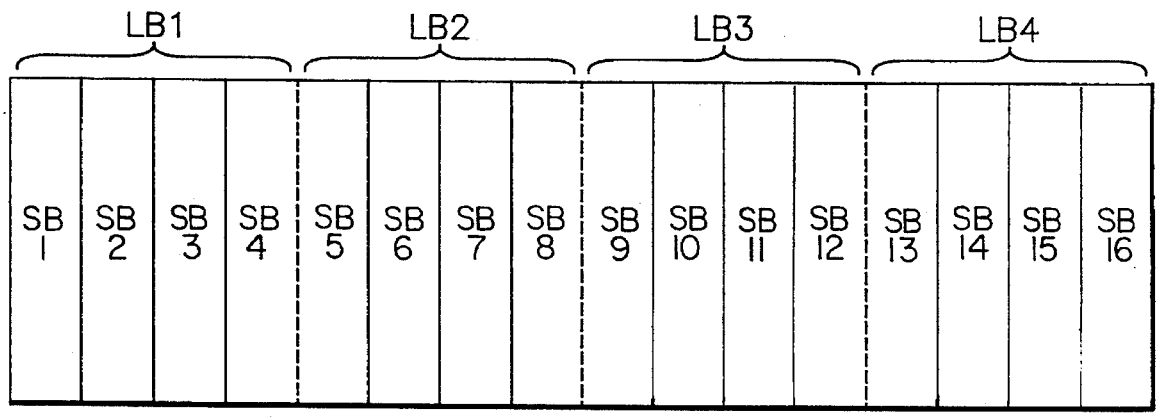
FIG. 4 is a diagram showing a cell array of FIG. 3 according to an embodiment of the present invention.

FIG. 4 is a diagram showing the construction of a cell array to explain a decoding circuit and method according to the present invention. Here, it is assumed that the construction of the cell array is composed of four large blocks LB1–LB4, each large block being composed of four small blocks. Accordingly, assuming that a cell array constitutes sixteen small blocks SB1–SB16, the construction of each circuit will be discussed hereinafter.

Figure 5:
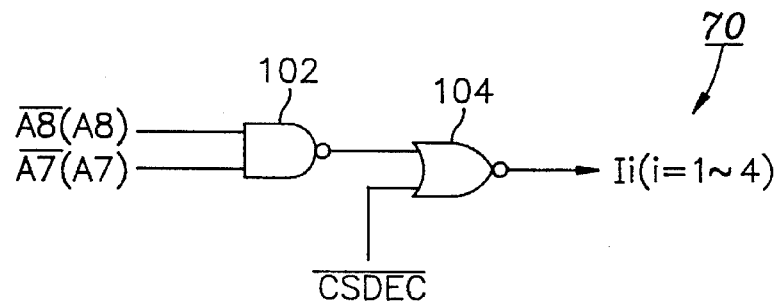
FIG. 5 is a circuit diagram showing a small block predecoder of FIG. 3 according to an embodiment of the present invention.

FIG. 5 is a circuit diagram showing small block predecoder 70 of FIG. 3 according to an embodiment of the present invention. Four small block predecoders are to be provided to the memory array of FIG. 4, and the structure of the small block predecoders is as shown in FIG. 5. Each of the small block predecoders combines column addresses A7, $\overline{A7}$, A8 and $\overline{A8}$ to generate the combined column addresses. The circuit of FIG. 5 includes NAND gate 102 for receiving any two signals of the column addresses A7, $\overline{A7}$, A8, and $\overline{A8}$ outputted from column address buffer 50 and associated with the selection of the small blocks, and NOR gate 104 for receiving the signal output of NAND gate 102 and decoding signal $\overline{CSDEC}$ derived from a chip enable signal to output one signal of small block selection signals Ii (where i=1–4). Here, the signal $\overline{CSDEC}$ represents a signal decoded by converting a chip selection signal $\overline{CS}$ supplied from a system into an internal signal level. As can be seen from such a construction, the number of the small blocks enabled by the output signal of the small block predecoder of FIG. 5 is four, which are simultaneously selected in such a manner as arranged in order of small blocks SB1, SB5, SB9, and SB13, or of small blocks SB2, SB6, SB10, and SB14 of FIG. 4. In the meanwhile, for the convenience of explanation, it is assumed that the addresses A7, $\overline{A7}$, A8, and $\overline{A8}$ are column addresses, but these may be varied according to the intention of the chip designer.

Figure 6:
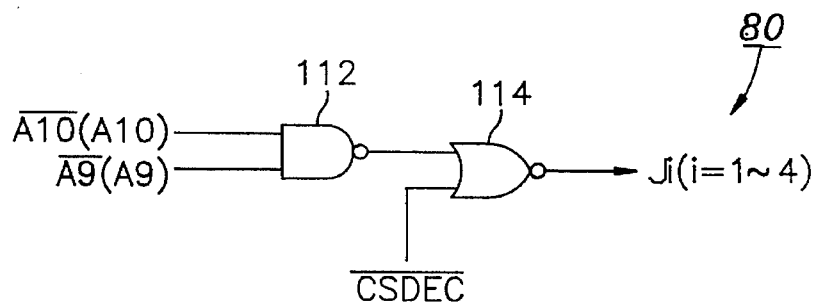
FIG. 6 is a circuit diagram showing a large block predecoder of FIG. 3 according to an embodiment of the present invention.

FIG. 6 is a circuit diagram showing large block predecoder 80 of FIG. 3 according to an embodiment of the present invention. There are provided four large block predecoders in FIG. 4 and one of the four large block predecoders is shown in FIG. 6. Each of the large block predecoders combines column addresses A9, $\overline{A9}$, A10 and $\overline{A10}$ to generate the combined column addresses. The circuit of FIG. 6 includes NAND gate 112 for receiving any two signals of column addresses A9, $\overline{A9}$, A10, and $\overline{A10}$ outputted from column address buffer 50 and associated with the selection of the large blocks, and NOR gate 114 for receiving the output signal of the NAND gate 112 and a decoding signal $\overline{CSDEC}$ derived from a chip enable signal to output one signal of large block selection signals Ji (where i=1–4). As can be seen from such a construction, one specific large block of large blocks LB1 to LB4 of FIG. 4 can be connected to a corresponding one of reading/writing circuits R/W1–R/W4, by the output signal of the large block predecoder of FIG. 6.

In the cell array construction of FIG. 4, the address signal outputted from the large block predecoder inputs to reading/writing circuit 100 and the large block corresponding thereto is then selected. Thereafter, the small block is selected by small block predecoder 70. Further, a predetermined column in the selected large block and the small block pertained thereto is selected by column decoder 90 of FIG. 3. Eventually, the decoding process of the large block and the small block is terminated. Such a decoding process will be clearly understood from the timing diagram of FIG. 7 according to the present invention.

With reference to FIG. 3, the decoding method according to the preferred embodiment of the present invention will now be discussed. The memory cells connected to the word line in a specific small block are selected by row decoder 40. Also, small blocks are selected by the upper bits of the address signal outputted from column decoder 90, and columns in the selected small blocks are selected by the lower bits of the address signal outputted therefrom. In this case, since a large block is not decoded, the small blocks corresponding to the address signal outputted from column decoder 90 are selected in the large blocks. Here, it may be expected that these plural selections of data lines will cause data collisions in input/output circuits. However, this is not a concern, because when a data reading operation is executed, data of the memory cells selected at every large block reaches a corresponding reading/writing circuit. But, of n reading/writing circuits R/W1–R/Wn, only one reading/writing circuit in response to the output signal of the large block predecoder 80 is enabled. The number of large blocks decoded by the enabled reading/writing circuit is one, so that the memory cell data in the enabled large block is read out and outputted. Hence, while undesired data cannot pass each corresponding reading/writing circuit, desired data ultimately reaches the input/output circuits. In the same manner as previously discussed, when a data writing operation is executed, since received data can pass only a predetermined reading/writing circuit, data is written into only memory cells in a given large block.

Figure 7:
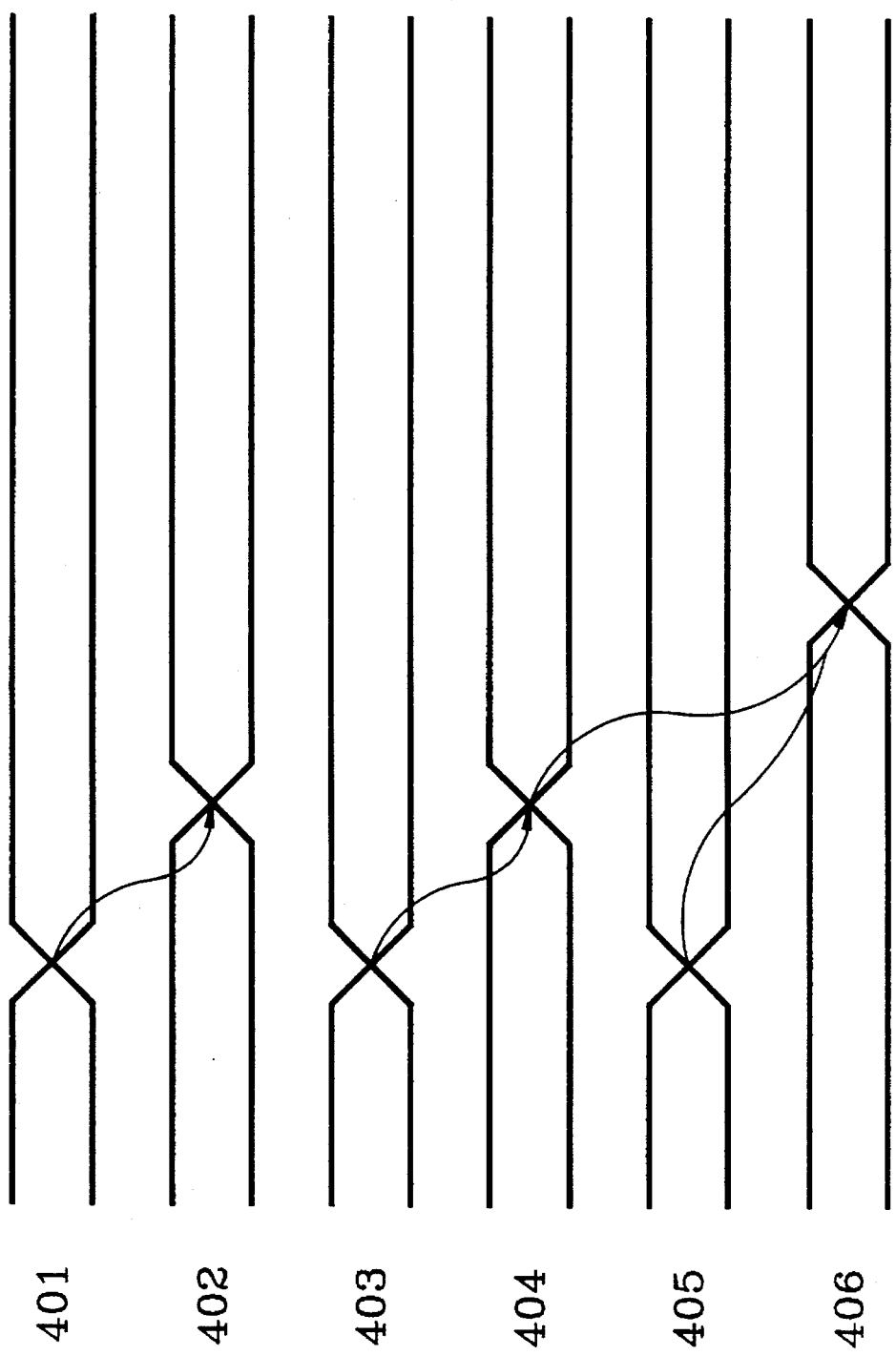
FIG. 7 is an operational timing diagram of FIG. 3 according to the constructions of FIGS. 4 to 6.

In the meanwhile, as shown in FIG. 7, reading/writing circuit selection signal 402 is enabled by large block selection address signal 401, thereby causing a predetermined reading/writing circuit to be selected. Then, small block selection signal 404 is enabled by small block selection signal 403, thereby causing small blocks in all large blocks to be respectively selected. Thereafter, column selection signal 406 is enabled by small block selection signal 404 and column selection address signal 405, thereby causing a predetermined column to be ultimately selected. Hence, a decoding process according to the present invention can reduce the total time delay taken in an address decoding process and layout area occupied by decoding circuits, since a large block decoding process is effectively reduced.

It should be noted that the decoding circuits and decoding method as shown in FIGS. 3 to 7 are made as optimum embodiments without departing from the technical spirit of the present invention. However, it would be obvious to those skilled in the art that such a decoding method may be also applied to other cell arrays and circuit construction. Further, in consideration of a redundant cell array (not shown) provided to increase the yield of semiconductor memory devices and a circuit construction for decoding the redundant cell array, the decoding circuits and decoding method according to the present invention should be executed. At the same time, a data input/output line and an input/output sense amplifier serving as typical connection and transmission means between a cell array and a data input/output buffer can be implemented in the unit of a small block or a large block.

As discussed above, there are provided a decoding circuit and method capable of simplifying a decoding process by individually performing large block decoding and small block decoding operations, thereby reducing the total time delay taken in an address decoding process and layout area occupied by the decoding circuit. Further, the decoding circuit and method according to the present invention may be easily applied to a conventional decoding method of a semiconductor memory device.

What is claimed is:

1. A decoding circuit for semiconductor memory device having a memory cell array including a plurality of large blocks, each large block comprising of m small blocks (wherein m=2,3, . . . ) including a plurality of memory cells being arranged in a matrix form, said circuit comprising:

a column decoder for selecting said small blocks and a bit line therein;

a small block predecoder for receiving a small block selection address to select said small blocks and for outputting said small block selection address to said column decoder;

a column predecoder for outputting a column selection address signal to said column decoder to select a predetermined column in said small blocks;

a reading/writing circuit for selecting said large blocks and for designating a data input/output path; and a large block predecoder for receiving a large block selection signal and, after decoding said large block selection signal, for outputting the decoded signal to only said reading/writing circuit.

2. A decoding method for selecting memory blocks in a semiconductor memory device having a memory cell array including a plurality of large blocks, each large block comprising m sub blocks (wherein m=2,3, . . . ) including a plurality of memory cells arranged in matrix form, said method comprising:

a first decoding step for simultaneously selecting specific sub blocks in each large block through a decoding circuit in response to a first address a second decoding step for selecting a column in said selected sub blocks through said decoding circuit; and a third decoding step for selecting one large block through an electrical path independent of said decoding circuit in response to a second address.

3. A decoding circuit as in claim 1 wherein said small block predecoder comprises at least one NAND gate and at least one NOR gate.

4. A decoding circuit as in claim 1 wherein said small block predecoder receives a chip select input signal to enable the small block predecoder.

5. A decoding circuit as in claim 1 wherein said large block predecoder comprises at least one NAND gate and at least one NOR gate.

6. A decoding circuit as in claim 1 wherein said large block predecoder receives as input a chip select signal to enable the large block decoder.

7. A decoding circuit as in claim 1 further comprising a column address buffer electrically connected with said column predecoder, said small block predecoder, and said large block predecoder, said column address buffer sending address signals to said column predecoder, said small block predecoder and said large block predecoder.

8. A decoding circuit as in claim 1 wherein said reading/writing circuit is electrically connected with the large block predecoder, the data input/output path and a data line interface to the small block memory cells.

9. A decoding circuit as in claim 1 wherein said reading/writing circuit receives said selected small blocks from the memory cell array and outputs them on the data input/output path.

10. A decoding circuit as in claim 1 wherein said reading/writing circuit receives data from the data input/output path and outputs the data to the small blocks of the semiconductor memory.

\* \* \* \* \*